(12) United States Patent
Chiu et al.

(10) Patent No.: US 8,947,100 B2
(45) Date of Patent: Feb. 3, 2015

(54) ELECTRONIC DEVICE, AND OPEN CIRCUIT DETECTING SYSTEM, DETECTING METHOD THEREOF

(75) Inventors: Jui-Jung Chiu, Hsinchu (TW); Yi-Kun Li, Hsinchu (TW)

(73) Assignee: TPK Touch Solutions Inc., Taipei (TW)

( * ) Notice: Subject to any disclaimer, the term of this patent is extended or adjusted under 35 U.S.C. 154(b) by 627 days.

(21) Appl. No.: 13/303,161

(22) Filed: Nov. 23, 2011

(65) Prior Publication Data

US 2012/0299602 A1    Nov. 29, 2012

(30) Foreign Application Priority Data

May 24, 2011    (CN) .......................... 2011 1 0136822

(51) Int. Cl.
*G01R 31/02*    (2006.01)
*G01R 31/04*    (2006.01)

(52) U.S. Cl.
CPC ............ *G01R 31/026* (2013.01); *G01R 31/024* (2013.01); *G01R 31/025* (2013.01); *G01R 31/028* (2013.01); *G01R 31/04* (2013.01)
USPC ........................................................ 324/548

(58) Field of Classification Search
CPC .... G01R 31/01; G01R 31/013; G01R 31/016; G01R 31/02; G01R 31/021; G01R 31/024; G01R 31/025; G01R 31/026; G01R 31/028; G01R 31/04
USPC .......................................... 324/548, 537, 500
See application file for complete search history.

(56) References Cited

U.S. PATENT DOCUMENTS 5,557,209 A * 9/1996 Crook et al. .................. 324/537
2009/0027059 A1 * 1/2009 Arguello ....................... 324/537

FOREIGN PATENT DOCUMENTS

CN    101369550 A    2/2009
CN    101699540 A    4/2010

* cited by examiner

*Primary Examiner* — Hoai-An D Nguyen
(74) *Attorney, Agent, or Firm* — Gokalp Bayramoglu

(57) ABSTRACT

An open circuit detecting system configured to connect to an object circuit for getting an electrical signal through a virtual ground induced by characteristic impedance of a parasitic capacitor and determining whether the object circuit is open according to the electrical signal.

19 Claims, 7 Drawing Sheets

ELECTRONIC DEVICE, AND OPEN CIRCUIT DETECTING SYSTEM, DETECTING METHOD THEREOF

BACKGROUND OF THE INVENTION

This application claims the benefit of the People's Republic of China Application No. 201110136822.9, filed on May 24, 2011.

FIELD OF THE INVENTION

The present disclosure relates generally to circuit detection technology, and more particularly to an electronic device, a detecting system and a method for an open circuit.

DESCRIPTION OF THE RELATED ART

There are two systems to detect open circuit, alternating current ("AC") detecting system and direct current ("DC") detecting system.

An alternating current detecting system for detecting open circuit is illustrated in FIG. 1. An object circuit under test is equivalent to an equivalent resistor and an equivalent capacitor connected to the resistor in series. In order to determine if the object circuit is electrically open or not, an AC source is connected between the end of the object circuit and the ground. The other end of the object circuit is connected to one end of a detecting module. This detection system has a physical ground loop. An AC signal generated by the AC source is transmitted to the detecting module through the object circuit. Thus, the detecting module can determine the status of the object circuit based on the AC signal's frequency or the magnitude.

A direct current detecting system for detecting open circuit is illustrated in FIG. 2. An object circuit under test can be represented as an equivalent resistor. To determine the status of the object circuit, a DC signal generated by a DC source is applied to one end of the object circuit. The other end of the object circuit is connected to one end of a detecting module. The other end of the DC source and the other end of the detecting module are also connected to the ground. This detection system has a physical ground loop. The detecting module can determine whether the object circuit is open through acquiring the current of the DC signal or the voltage of the DC signal.

A typical detecting system has a physical ground loop. Various wires within the system may affect the detecting system. As a result, detection system may not always determine the true state of the object circuit. The equivalent resistance generated by wires in an alternating current detecting system may be large. According to the formula V(noise)=I(noise)*Z(line) weak noise (I(noise)) will become a large interfering signal (V(noise)) while it flows through the resistor (Z(line)). One solution to this problem is adding a filter module. However, only specific frequency can be filtered by the filter module. While filters are useful eliminating unwanted frequencies from a given signal, some desired frequencies in the signal may also be removed from the signal causing desired features to be lost. Furthermore, if the capacitance in the object circuit is low, the frequency of the AC signal must be increased. This increase in frequency will result potential degradation in AC signal due to the parasitic capacitance and loop impedance. An extra compensating circuit may be needed to eliminate these undesired effects. The long thin grounding wires in a DC system reduce the voltage as well as increasing the system noise. In order to ensure a high degree of accuracy, the voltage amplitude and the level of sampling resolution must be increased in these systems.

The current invention solves these mentioned problems.

SUMMARY OF THE INVENTION

It is the object of the present invention to determine the status of an object circuit by using certain features of the object circuit and performing this determination in spite of the noise generated by various circuit elements and their interactions with each other.

An open circuit detecting system is configured to connect to an object circuit for getting an electrical signal through a virtual ground induced by characteristic impedance of a parasitic capacitor and determining whether the object circuit is open according to the electrical signal.

In a preferred embodiment, the electrical signal obtained by the open circuit detecting system indicates that the capacitance of the parasitic capacitor in normal circuit is greater than the capacitance of the parasitic capacitor in open circuit.

In a preferred embodiment, the open circuit detecting system includes a test unit connected to the object circuit and testing the capacitance of the parasitic capacitor and a sampling unit connected to the test unit and reflecting states of the parasitic capacitor.

In a preferred embodiment, the test unit is configured to generate a burst pulse for charging the parasitic capacitor, and the sampling unit is configured to discharge the charged parasitic capacitor.

In a preferred embodiment, the rising edge of the burst pulse is before the falling edge of the burst pulse.

In a preferred embodiment, the open circuit detecting system further includes a stray-capacitance boosting unit connected to the object circuit, the test unit, and the sampling unit for amplifying charging and discharging effects.

In a preferred embodiment, the stray-capacitance boosting unit is an Insulated Gate Bipolar Transistor, a triode, or a Darlington Transistor.

In a preferred embodiment, the sampling unit is a sampling resistor.

In a preferred embodiment, the open circuit detecting system further includes a signal processing unit connected to the sampling unit and configured to convert the electrical signal into an identification signal.

In a preferred embodiment, the signal processing unit is configured to convert the electrical signal into several numbers of pulses corresponding to the capacitance of the parasitic capacitor.

In a preferred embodiment, the signal processing unit includes: an inverter, a comparator connected to the inverter and an "AND" gate connected to the comparator.

In a preferred embodiment, the open circuit detecting system includes a test unit, a stray-capacitance boosting unit, a sampling unit, and a signal processing unit; wherein the sampling unit is a sampling resistor, the signal processing unit comprises an inverter, a comparator connected to the inverter, and an "AND" gate connected to the comparator, one end of the test unit is connected to a power supply, and the other end of the test unit is connected to a first input of the stray-capacitance boosting unit, a second input of the stray-capacitance boosting unit is connected to the object circuit, an output of the stray-capacitance boosting unit is connected to one end of the sampling resistor, and the other end of the sampling resistor is connected to the ground, an input of the inverter is connected to the common point of the stray-capacitance boosting unit and the sampling resistor, an output of the inverter is connected to a negative terminal of the comparator, an positive terminal of the comparator is configured to receive a reference voltage, an output of the comparator is connected to a first input of the "AND" gate, a second input of the "AND" gate is configured to receive a gate pulse, an output of the "AND" gate is used to output several number of pulses corresponding to the capacitance of the parasitic capacitor.

A method for detecting open circuit includes the steps of: acquiring an electrical signal through a virtual ground induced by characteristic impedance of a parasitic capacitor: and determining whether the object circuit is open according to the electrical signal.

In a preferred embodiment, the electrical signal indicates the capacitance of the parasitic capacitor in normal circuit is greater than the capacitance of the parasitic capacitor in open circuit.

A method for detecting open circuit includes the steps of connecting a parasitic capacitor to a virtual ground through characteristic impedance of the parasitic capacitor; testing the capacitance of the parasitic capacitor and generating an electrical signal representing the capacitance of the parasitic capacitor; and determining whether the object circuit is open according to the electrical signal.

In a preferred embodiment, the electrical signal indicates the capacitance of the parasitic capacitor in normal circuit is greater than the capacitance of the parasitic capacitor in open circuit.

In a preferred embodiment, the step of testing includes: generating a burst pulse for charging the parasitic capacitor, and discharging the parasitic capacitor though a sampling unit to generate the electrical signal.

In a preferred embodiment, the method further includes the steps of: converting the electrical signal into an identification signal; and determining whether the object circuit is open according to the identification signal.

An electronic device includes an object circuit and an open circuit detecting system. The open circuit detecting system is connected to the object circuit for getting an electrical signal through a virtual ground induced by characteristic impedance of a parasitic capacitor and determining whether the object circuit is open or not electrically connected to the open circuit detecting system according to the electrical signal.

BRIEF DESCRIPTION OF THE DRAWINGS

The components in the drawings are not necessarily drawn to scale, the emphasis instead being placed upon clearly illustrating the principles of the present disclosure.

DETAILED DESCRIPTION OF THE EMBODIMENTS

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
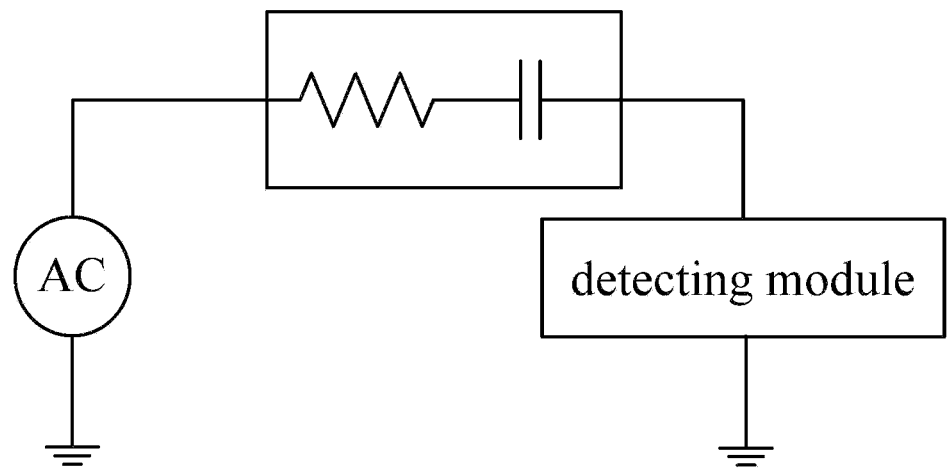
FIG. 1 is a functional block diagram of a traditional alternating current detecting system for detecting open circuit.
Figure 2:
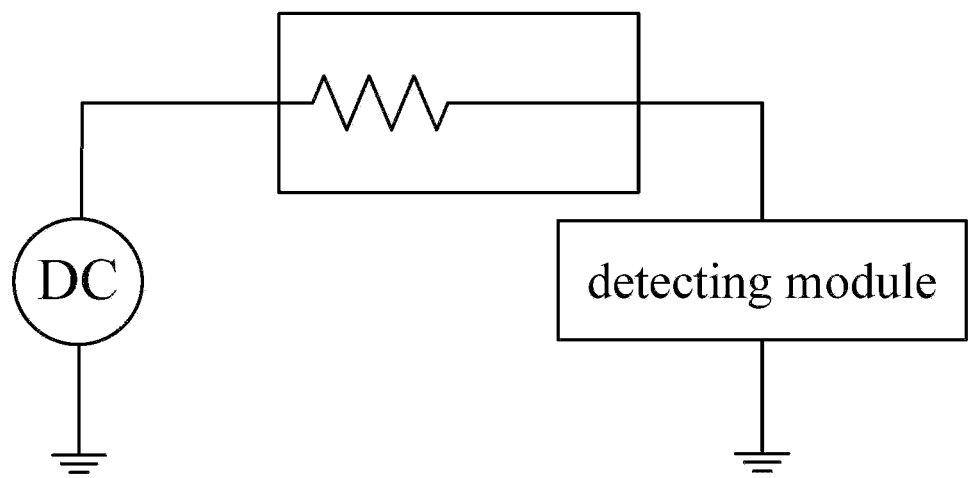
FIG. 2 is a functional block diagram of a traditional direct current detecting system for detecting open circuit.
Figure 3:
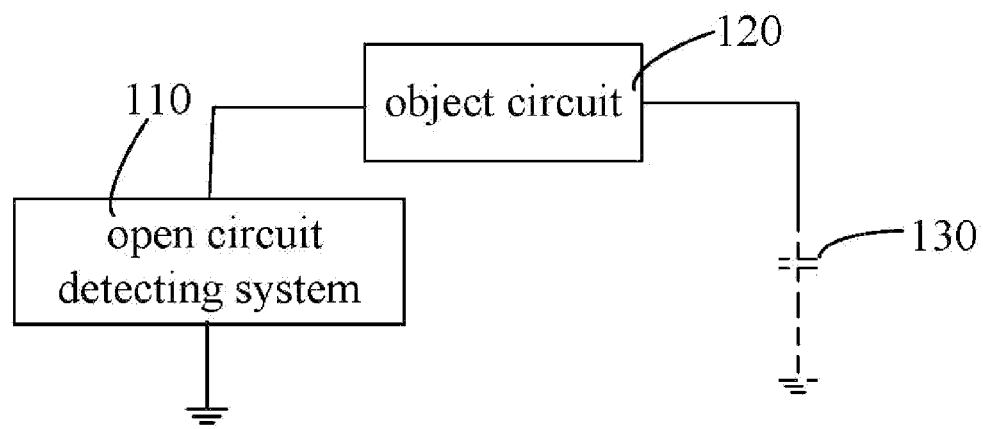
FIG. 3 is a functional block diagram of a first embodiment of an open circuit detecting system.

Referring to FIG. 3, a first embodiment of an open circuit detecting system 110 is illustrated.

One end of the open circuit detecting system 110 is connected to the ground, and the other end of the open circuit detecting system 110 is connected to an object circuit 120. The open circuit detecting system 110 is a circuit or device with the function of detecting open circuit.

The object circuit 120 is a circuit or device under test in which an open circuit may exist. In normal circuit, one end of the object circuit 120 is connected to the open circuit detecting system 110, and the other end of the object circuit 120 is connected to a virtual ground induced by characteristic impedance of a parasitic capacitor 130. The parasitic capacitor 130 which is the capacitance that exists between conductors of the circuit, between conductors or components and ground, or between components has no physical reality. For the convenience of description, the parasitic capacitor 130 is fabricated to represent all the parasitic capacitor of the object circuit 120.

According to physical law, the capacitance is proportional to the length of conductors in circuit. The parasitic capacitor 130 in normal circuit is greater than the parasitic capacitor 130 in open circuit, since the conductor in normal circuit is longer than the conductor in open circuit. When the capacitance is determined, the status of the circuit could be found out by an experienced person or a machine. Therefore, the open circuit detecting system 110 is arranged for inducing an electrical signal and the electrical signal is used for indicating that the capacitance of the parasitic capacitor 130 in normal circuit is greater than the capacitance of the parasitic capacitor 130 in open circuit.

Working on a specific frequency, the parasitic capacitor 130 is connected to the virtual ground by characteristic impedance. In other words, the parasitic capacitor 130 is not connected to the ground in reality, but the potential difference between the parasitic capacitor 130 and the ground is zero. The open circuit detecting system 110 begins to work under a reference potential and provides the electrical signal which indicates that the circuit of the object circuit 120 is open.

Figure 4:
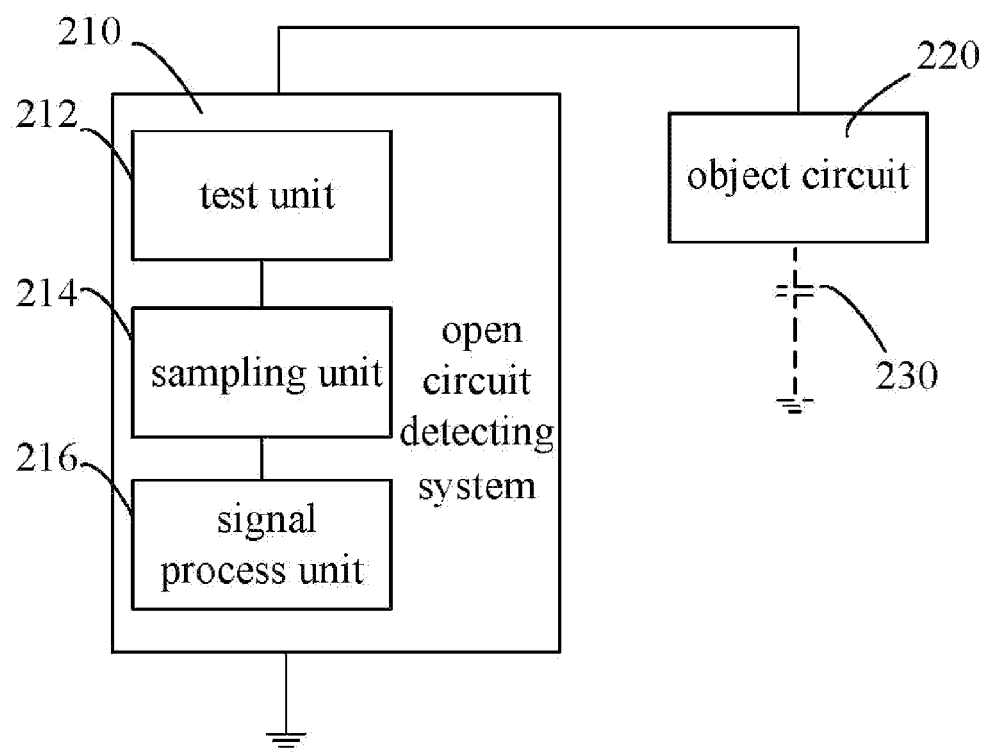
FIG. 4 is a functional block diagram of a second embodiment of an open circuit detecting system.

Referring to FIG. 4, a second embodiment of an open circuit detecting system 210 is illustrated. A parasitic capacitor 230 which is the capacitance that exists between conductors of the circuit, between conductors and ground, between components and ground, or between components has no physical reality. For the convenience of description, the parasitic capacitor 230 is fabricated to represent all the parasitic capacitor of an object circuit 220.

According to physical law, the capacitance is in proportion to the length of conductors. The parasitic capacitor 230 in normal circuit is greater than the parasitic capacitor 230 in open circuit, since the conductor in normal circuit is longer than the conductor in open circuit. When the capacitance is determined, the status of the circuit could be found out by an experienced person or a machine. Therefore, the open circuit detecting system 210 is arranged for inducing an electrical signal and the electrical signal is used for indicating that the capacitance of the parasitic capacitor 230 in normal circuit is greater than the capacitance of the parasitic capacitor 230 in open circuit. In normal circuit, one end of the open circuit detecting system 210 is connected to the ground, and the other end of the open circuit detecting system 210 is connected to the object circuit 220.

The open circuit detecting system 210 is a circuit or device with the function of detecting open circuit. The open circuit detecting system 210 includes a test unit 212 connected to the object circuit 220, a sampling unit 214 connected to the test unit 212, and a signal processing unit 216 connected to the sampling unit 214.

The test unit 212 is used for testing the capacitance of the parasitic capacitor 230. The test unit 212 tests the capacitance of the parasitic capacitor 230 by charging the parasitic capacitor 230 or a resonance circuit including the parasitic capacitor 230. If the test unit 212 provides the same testing signals, charging time constants or discharging time constants in open circuit and normal circuit are different because of different parasitic capacitor.

The sampling unit 214 reflects the states of the parasitic capacitor 230. The sampling unit 214 may be a sampling resistor or other circuits with sampling function. The electrical signal which is easy to be observed is sampled by the sampling unit 214. As to the object circuit 220, the charging time constant in open circuit is smaller than the charging time constant in normal circuit. When the capacitance is determined, the status of circuit could be found out by an experienced person or a machine. Likewise, the parasitic capacitor 230 discharges though the sampling unit 214 after being charged by the test unit 212. The electrical signal which is easy to be observed is sampled by the sampling unit 214. As to the object circuit 220, the parasitic capacitor 230 in normal circuit is greater than the parasitic capacitor 230 in open circuit. When the capacitance is determined, the status of the circuit is found out by an experienced person or a machine. Similarly, resonance frequencies vary in different resonance circuits including different parasitic capacitor, identical resistors, and identical inductors. The sampling unit 214 obtains a resonance signal from the resonance circuit including the test unit 212 and the parasitic capacitor 230. When the capacitance is determined, the status of the circuit could be found out by an experienced person or a machine.

To realize automation, the signal processing unit 216 is added to convert the electrical signal into an identification signal which is easy to be recognized by machines. "AND", "OR", "NOT" and comparison operations or combining with other signals are performed by the signal processing unit 216 to convert the electrical signal obtained from the sampling unit 214 into the identification signal which is easy to be recognized by machines. The identification signal is sent to a computer, a digital signal processor (DSP), an advanced RISC machine and so on for computing or displaying after the identification signal was obtained.

Working on a specific frequency, the parasitic capacitor 230 is connected to the virtual ground by characteristic impedance. In other words, the parasitic capacitor 230 is not connected to the ground in reality, but the potential difference between the parasitic capacitor 230 and the ground is zero. The open circuit detecting system 210 begins to work after a reference potential is got. The open circuit detecting system 210 checks the object circuit 220 to find out whether the circuit is open. The test unit 212 begins to test the capacitance of the parasitic capacitor 230 by charging the parasitic capacitor 230 or the resonant circuit including the parasitic capacitor 230. As to the object circuit 220, the parasitic capacitor 230 in normal circuit is greater than the parasitic capacitor 230 in open circuit. The sampling unit 214 provides the electrical signal when the parasitic capacitor 230 discharges through the sampling unit 214. Preferably, the electrical signal is easy to be observed or processed by a machine. To realize automation, the signal processing unit 216 converts the electrical signal into the identification signal which is easy to be recognized by machines. The "AND", "OR". "NOT" and comparison operations or combining with the other signals are performed by the signal processing unit 216 to convert the electrical signal obtained from the sampling unit 214 into the identification signal which is easy to be recognized by machines. The identification signal may be sent to the computer for computing or displaying, thus the state of the object circuit 220 can be provided by the computer.

Figure 5:
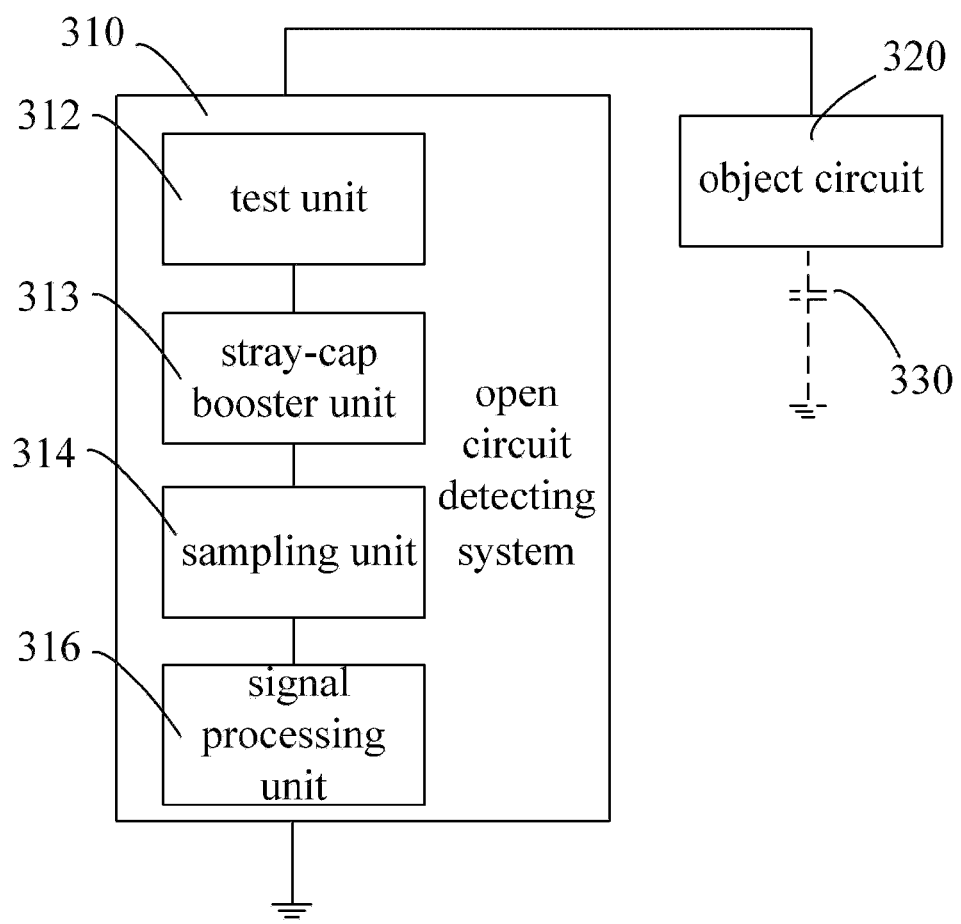
FIG. 5 is a functional block diagram of a third embodiment of an open circuit detecting system.
Figure 6:
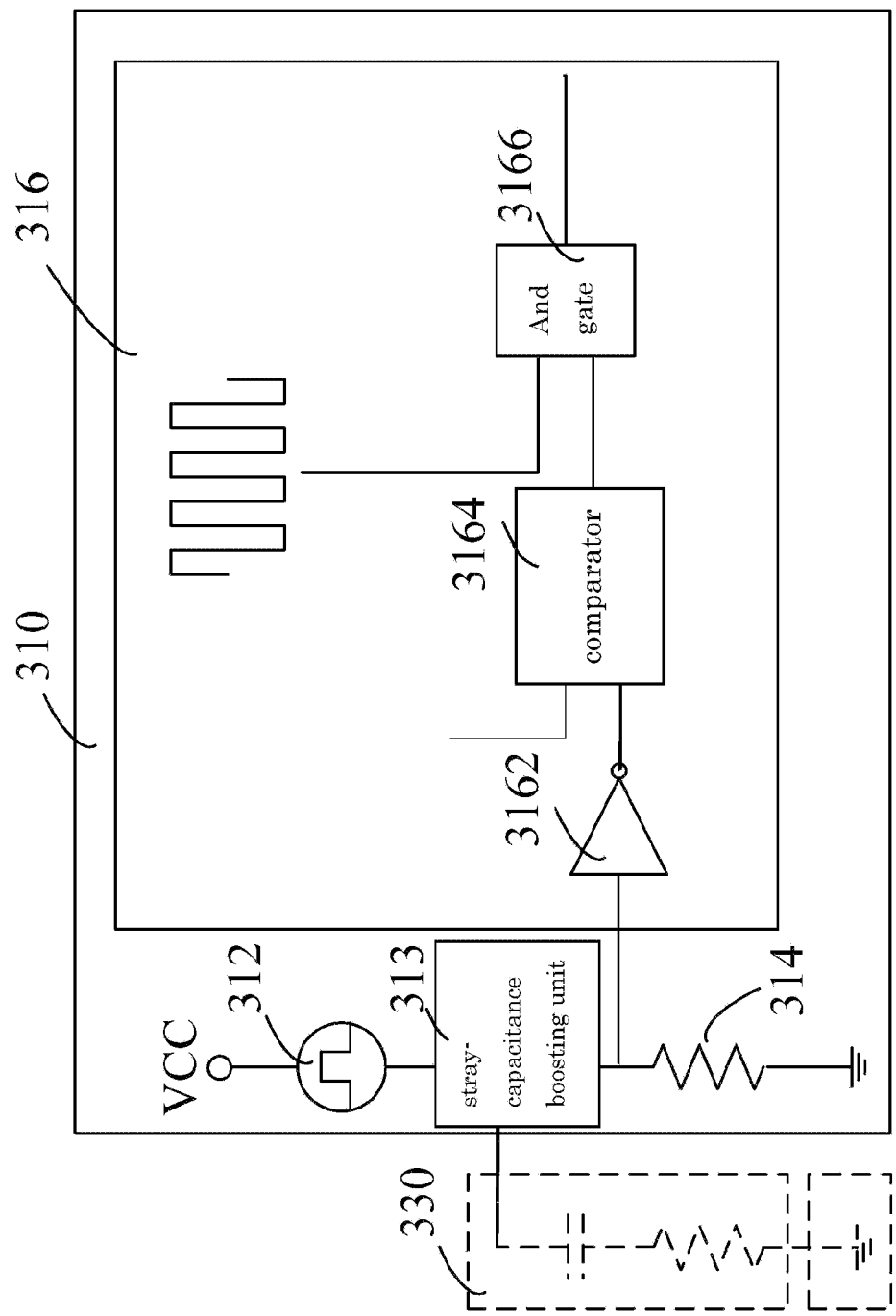
FIG. 6 is a circuit diagram of the third embodiment of an open circuit detecting system.

Referring to FIG. 5 and FIG. 6, a third embodiment of an open circuit detecting system 310 is illustrated. One end of the open circuit detecting system 310 is connected to the ground, and the other end of the open circuit detecting system 310 is connected to an object circuit 320. A parasitic capacitor 330 which is the capacitance that exists between conductors of the circuit, between conductors and ground, between components and ground, or between components has no physical reality. For the convenience of description, the parasitic capacitor 330 is fabricated to represent all the parasitic capacitor in the object circuit 320. The detecting relates only to the parasitic capacitor 330, for the convenience of description, the object circuit 320 is omitted in FIG. 6. Furthermore, the parasitic capacitor 330 has its own resistance, and therefore, an equivalent capacitor and an equivalent resistor are connected in series in FIG. 6 for representing the parasitic capacitor 330.

The open circuit detecting system 310 is a circuit or device with the function of detecting open circuit. The open circuit detecting system 310 includes a test unit 312, a stray-cap booster unit 313 connected to the test unit 312 and the parasitic capacitor 330, a sampling unit 314 connected to the stray-cap booster unit 313, and a signal processing unit 316 connected to the sampling unit 314.

The test unit 312 is for generating a burst pulse. One end of the test unit 312 is connected to a power supply, and the other end of the test unit 312 is connected to a first input of the stray-capacitance boosting unit 313. The test unit 312 is electrically connected to the parasitic capacitor 330 though the stray-capacitance boosting unit 313. Therefore, the test unit 312 charges the parasitic capacitor 330 though the stray-capacitance boosting unit 313.

The stray-capacitance boosting unit 313 is configured for amplifying charging and discharging effects. It may be an Insulated Gate Bipolar Transistor, a transistor, a Darlington Transistor or other circuits with the amplifying function. The first input of the stray-capacitance boosting unit 313 is connected to the test unit 312, a second input of the stray-capacitance boosting unit 313 is connected to the parasitic capacitor 330, and an output of the stray-capacitance boosting unit 313 is connected to the common point of the sampling unit 314 and the signal processing unit 316. In an exemplary embodiment, the stray-capacitance boosting unit 313 is a transistor, the first input of the stray-capacitance boosting unit 313 is an emitter of the transistor, the second input of the stray-capacitance boosting unit 313 is a base of the transistor, and the output of the stray-capacitance boosting unit 313 is a collector of the transistor. A burst pulse generated by the test unit 312 charges the parasitic capacitor 330 via the emitter of the transistor and the base of the transistor. The emitter-base junction is forward biased until the voltage, of the parasitic capacitor 330 rises up to a preset voltage. Working in the linear region of the transistor, the transistor is in active mode, thus the charging and discharging effects is amplified. A discharge current flows through the sampling unit 314 and then forms a voltage signal.

The sampling unit 314 reflects the states of the parasitic capacitor 330. The sampling unit 314 can be a sampling resistor or other circuits with sampling function. One end of the sampling unit 314 is connected to the common point of the stray-capacitance boosting unit 313 and the signal processing unit 316, and the other end of the sampling unit 314 is connected to the ground. The discharge current of the parasitic capacitor 330 flows from the stray-capacitance boosting unit 313 to the ground via the sampling unit 314, and the voltage signal is sampled from the common point of the stray-capacitance boosting unit 313 and the sampling unit 314. At last, the voltage signal is sent to the signal processing unit 316.

The signal processing unit 316 includes an inverter 3162, a comparator 3164 connected to the inverter 3162, an "AND" gate 3166 connected to the comparator 3164.

An input of the inverter 3162 is connected to the common point of the stray-capacitance boosting unit 313 and the sampling unit 314, and an output of the inverter 3162 is connected to a negative terminal of the comparator 3164. The inverter 3162 inverts the voltage signal provided by the sampling unit 314. The inverter 3162 has relatively high input impedance so it has an insignificant effect on the voltage signal.

A reference voltage is applied to a positive terminal of the comparator 3164, the negative terminal of the comparator 3164 is connected to the output of the inverter 3162. When the voltage at the positive terminal is higher than the voltage at the negative terminal, that is, the reference voltage is higher than the output voltage of the inverter 3162, the output voltage of the comparator 3164 is high-level. Otherwise, the output voltage of the comparator 3164 is low-level.

A first input of the "AND" gate 3166 is connected to the comparator 3164, a second input of the "AND" gate 3166 is used to receive gate pulses. Only the first input of the "AND" gate 3166 and the second input of the "AND" gate 3166 are both high-level, an output of the "AND" gate 3166 is high-level. That is, when the first input of the "AND" gate 3166 is high-level, the output of the "AND" gate 3166 output gate pulses. Otherwise, when the first input of the "AND" gate 3166 is low-level, the "AND" gate 3166 will not output any signal.

A sequence diagram is combined below to describe a course of work in this embodiment of the open circuit detecting system 310.

Figure 7:
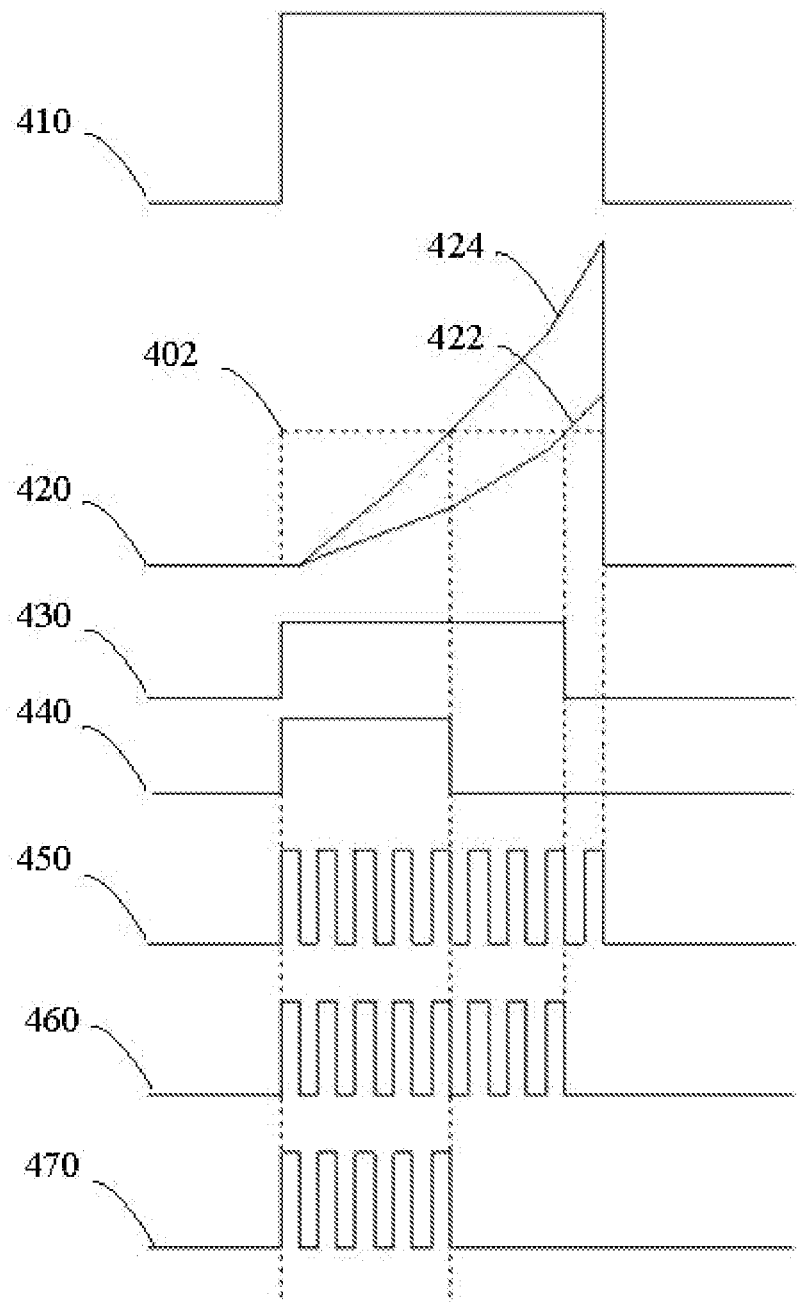
FIG. 7 is a sequence diagram of an open circuit detecting system.

Referring to FIG. 7, working on the specific frequency, the parasitic capacitor 330 is connected to the virtual ground by characteristic impedance. In other words, the parasitic capacitor 330 is not connected to the ground in reality, but the potential difference between the parasitic capacitor 130 and the ground is zero. The open circuit detecting system 310 begins to work under the reference potential. The open circuit detecting system 310 begins to fund out whether the circuit is open.

The test unit 312 generates a burst pulse 410. The burst pulse 410 is a square wave signal that the rising edge is before the failing edge. When the burst pulse 410 is high-level, the inverter 3162, the comparator 3164 and the "AND" gate are enabled. The burst pulse 410 charges the parasitic capacitor 330. For the equivalent resistor is low, the charging process is finished in a short time. The discharge current is amplified by the stray-capacitance boosting unit 313 and flows to the sampling unit 314. Then, the discharge current forms the voltage signal at the sampling unit 314. The voltage signal is changed into an inverter output signal 420 by the inverter 3162. The inverter output signal 420 is sent to the negative terminal of the comparator 3164, and compared with a reference voltage 402 sent to the positive terminal of the comparator 3164. When the reference voltage 402 at the positive terminal of the comparator 3164 is higher than the voltage of the inverter output signal 420 at the negative terminal of the comparator 3164, the output voltage of the comparator 3164 is high-level, otherwise, the output voltage of the comparator 3164 is low-level. An "AND" operation between the output signal of the comparator 3164 and the gate pulses is performed. When the output of the comparator 3164 is high-level, the output of the "AND" gate 3166 output gate pulses. Otherwise, when the output of the comparator 3164 is low-level, the "AND" gate 3166 will not output any signal. As mentioned above, the parasitic capacitor 330 in normal circuit is greater than the parasitic capacitor 330 in open circuit, for the convenience of description, the parasitic capacitor 330 in normal circuit is called big capacitor. On the contrary, the parasitic capacitor 330 in open circuit is called small capacitor. Because of the discharging characteristics of the capacitor, the inverter output signal 420 rises up slowly. A signal line 422 of the big capacitor in the inverter output signal 420 rises up more slowly than a signal line 424 of the small capacitor in the inverter output signal 420. Thus the duty ratio of a big capacitor comparator output signal 430 is greater than a small capacitor comparator output signal 440. An "AND" operation between the output signal of the comparator 3164 which is sent to the first input of the "AND" gate 3166 and gate pulses 450 which is sent to the second input of the "AND" gate 3166 is performed. For the duty radio of the big capacitor comparator output signal 430 is greater than the duty radio of the small capacitor comparator output signal 440, the number of pulses of a big capacitor "AND" gate output signal 460 is more than that of a small capacitor "AND" gate output signal 470. The number of pulses is sent to the processor, such as computer, digital signal processor (DSP), advanced RISC machines and so on for computing or displaying.

Figure 8:
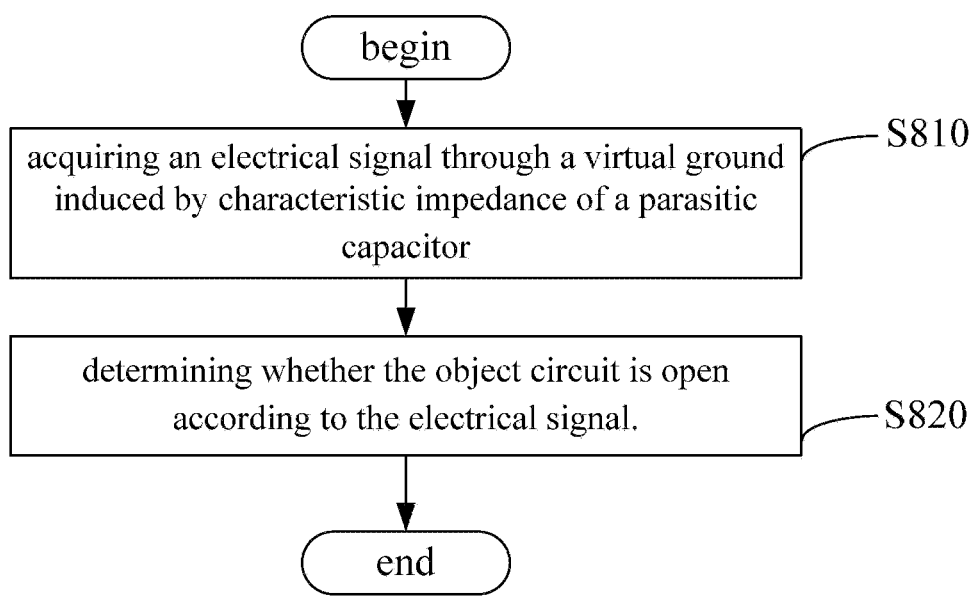
FIG. 8 is a flowchart of a first embodiment of an open circuit detecting method.

Referring to FIG. 8, a first embodiment of an open circuit detecting method is illustrated.

Step S810 represents acquiring an electrical signal through a virtual ground induced by characteristic impedance of a parasitic capacitor. In other words, the parasitic capacitor is not connected to the ground in reality, but the potential difference between the parasitic capacitor and the ground is zero. The open circuit detecting system begins to work under the reference potential, and the electrical signal which indicates that the circuit in the object circuit is open is acquired. For the parasitic capacitor cannot be directly observed, the parasitic capacitor is charged for generating the electrical signal which is easy to be observed.

Step S820 represents determining whether the object circuit is open according to the electrical signal. When the electrical signal is determined, the status of the circuit could be found out by an experienced person or a machine. More specifically, the electrical signal indicates the capacitance of the parasitic capacitor in normal circuit is greater than the capacitance of the parasitic capacitor in open circuit.

Figure 9:
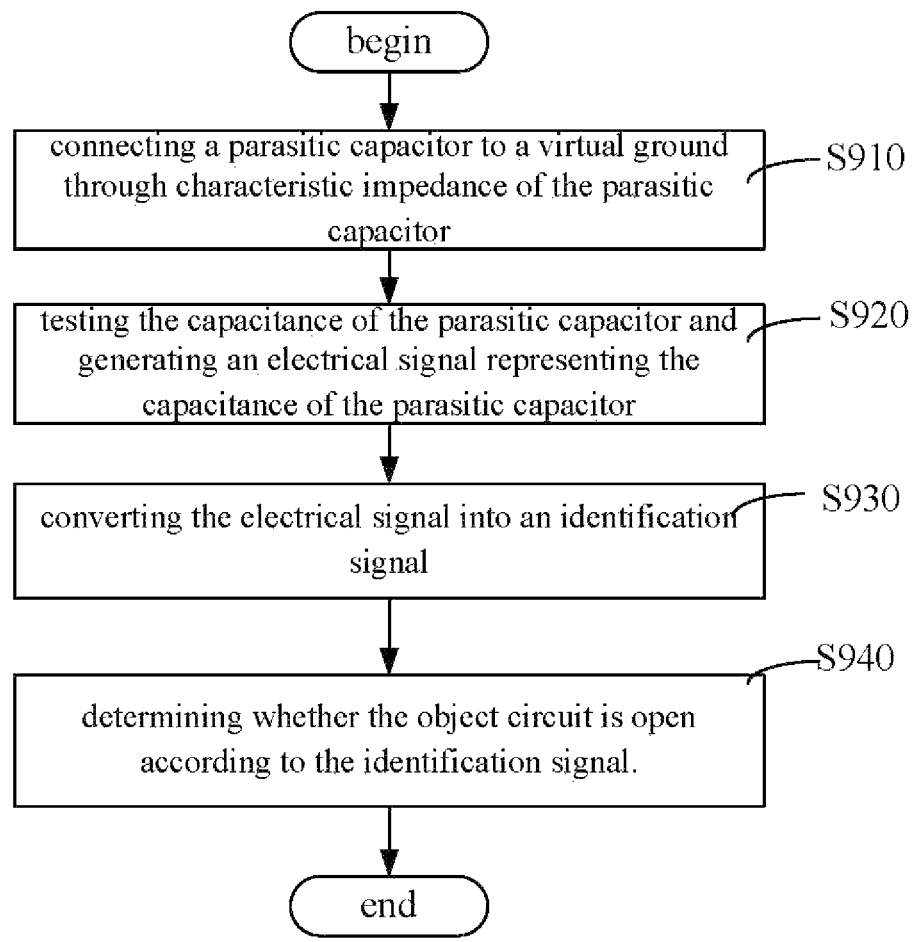
FIG. 9 is a flowchart of a second embodiment of an open circuit detecting method.

Referring to FIG. 9, a third embodiment of an open circuit detecting method is illustrated.

Step S910 represents connecting a parasitic capacitor to a virtual ground through characteristic impedance of the parasitic capacitor. Working on a specific frequency, the parasitic capacitor is connected to the virtual ground by characteristic impedance. In other words, the parasitic capacitor is not connected to the ground in reality, but the potential difference between the parasitic capacitor and the ground is zero.

Step S920 represents testing the capacitance of the parasitic capacitor and generating an electrical signal representing the capacitance of the parasitic capacitor. For the parasitic capacitor cannot be directly observed, the parasitic capacitor is charged for generating the electrical signal which is easy to be observed.

Step S930 represents converting the electrical signal into an identification signal. To realize automation, a signal processing unit is added to convert the electrical signal into the identification signal. "AND", "OR", "NOT" and comparison operations or combining with the other signal can be used in the converting process.

In step S940, it is determined that whether the object circuit is open according to the identification signal. Preferably, the identification signal is sent to the computer for computing or displaying after the identification signal was obtained. At last, the state of the object circuit is found out. As described above, the capacitance of the parasitic capacitor in normal circuit is greater than the capacitance of the parasitic capacitor in open circuit.

The open circuit detecting system and method can be used in electronic devices, such as mobile phones, laptop computers, personal digital assistants, etc. If the open circuit detecting system is incorporated in an electronic device, the object circuit can be any other parts of the electronic device. The open circuit detecting system is connected to the object circuit for getting an electrical signal through a virtual ground induced by characteristic impedance of a parasitic capacitor and determining whether the object circuit is open or not electrically connected to the open circuit detecting system according to the electrical signal. The electrical signal obtained by the open circuit detecting system indicates that the capacitance of the parasitic capacitor in normal circuit is greater than that if the object circuit is open internally or not electrically connected to the open circuit detecting system. Taking a mobile phone with a touch panel as an example, the open circuit detecting system may be integrated in a chip and the object circuit may be a flex-cable or conductive trace on glass. If the flex-cable or conductive trace on glass is open internally or not electrically connected to the chip, the parasitic capacitor will be smaller than that in normal state.

Although the invention has been described in language specific to structural features and/or methodological acts, it is to be understood that the invention defined in the appended claims is not necessarily limited to the specific features or acts described. Rather, the specific features and acts are disclosed as sample forms of implementing the claimed invention.

What is claimed is:

1. An open circuit detecting system configured to connect to an object circuit for getting an electrical signal through a virtual ground induced by characteristic impedance of a parasitic capacitor and determining whether the object circuit is open according to the electrical signal, wherein the open circuit detecting system comprises a test unit, a stray-capacitance boosting unit, a sampling unit, and a signal processing unit;

wherein the sampling unit is a sampling resistor, the signal processing unit comprises an inverter, a comparator connected to the inverter, and an "AND" gate connected to the comparator, the test unit is connected to the stray-capacitance boosting unit, a second input of the stray-capacitance boosting unit is connected to the object circuit, an output of the stray-capacitance boosting unit is connected to the sampling resistor, an input of the inverter is connected to the common point of the stray-capacitance boosting unit and the sampling resistor, an output of the inverter is connected to a negative terminal of the comparator, an positive terminal of the comparator is configured to receive a reference voltage, an output of the comparator is connected to a first input of the "AND" gate, a second input of the "AND" gate is configured to receive a gate pulse.

2. The open circuit detecting system as claim 1, wherein the electrical signal obtained by the open circuit detecting system indicates that the capacitance of the parasitic capacitor in normal circuit is greater than the capacitance of the parasitic capacitor in open circuit.

3. The open circuit detecting system as claim 2, wherein one end of the test unit is connected to a power supply, and the other end of the test unit is connected to a first input of the stray-capacitance boosting unit.

4. The open circuit detecting system as claim 3, wherein the test unit is configured to generate a burst pulse for charging the parasitic capacitor, and the sampling unit is configured to discharge the charged parasitic capacitor.

5. The open circuit detecting system as claim 4, wherein the rising edge of the burst pulse is before the falling edge of the burst pulse.

6. The open circuit detecting system as claim 1, wherein the stray-capacitance boosting unit is configured to amplify charging and discharging effects.

7. The open circuit detecting system as claim 6, wherein the stray-capacitance boosting unit is an Insulated Gate Bipolar Transistor, a triode, or a Darlington Transistor.

8. The open circuit detecting system as claim 1, wherein the output of the stray-capacitance boosting unit is connected to one end of the sampling resistor, and the other end of the sampling resistor is connected to the ground.

9. The open circuit detecting system as claim 1, wherein the signal processing unit is configured to convert the electrical signal into an identification signal.

10. The open circuit detecting system as claim 9, wherein the signal processing unit is configured to convert the electrical signal into several number of pulses corresponding to the capacitance of the parasitic capacitor.

11. The open circuit detecting system as claim 9, wherein an output of the "AND" gate is used to output the several number of pulses corresponding to the capacitance of the parasitic capacitor.

12. A method for detecting open circuit comprising the steps of:

providing an open circuit detecting system to connect to an object circuit for acquiring an electrical signal through a virtual ground induced by characteristic impedance of a parasitic capacitor, wherein the open circuit detecting system comprises a test unit, a stray-capacitance boosting unit, a sampling unit, and a signal processing unit;

wherein the sampling unit is a sampling resistor, the signal processing unit comprises an inverter, a comparator connected to the inverter, and an "AND" gate connected to the comparator, the test unit is connected to the stray-capacitance boosting unit, a second input of the stray-capacitance boosting unit is connected to the object circuit, an output of the stray-capacitance boosting unit is connected to the sampling resistor, an input of the inverter is connected to the common point of the stray-capacitance boosting unit and the sampling resistor, an output of the inverter is connected to a negative terminal of the comparator, an positive terminal of the comparator is configured to receive a reference voltage, an output of the comparator is connected to a first input of the "AND" gate, a second input of the "AND" gate is configured to receive a gate pulse; and determining whether the object circuit is open according to the electrical signal.

13. The method as claim 12, wherein the electrical signal indicates the capacitance of the parasitic capacitor in normal circuit is greater than the capacitance of the parasitic capacitor in open circuit.

14. A method for detecting open circuit comprising the steps of:
connecting a parasitic capacitor to a virtual ground through characteristic impedance of the parasitic capacitor;
providing an open circuit detecting system for testing the capacitance of the parasitic capacitor and generating an electrical signal representing the capacitance of the parasitic capacitor, wherein the open circuit detecting system comprises a test unit, a stray-capacitance boosting unit, a sampling unit, and a signal processing unit;
wherein the sampling unit is a sampling resistor, the signal processing unit comprises an inverter, a comparator connected to the inverter, and an "AND" gate connected to the comparator, the test unit is connected to the stray-capacitance boosting unit, a second input of the stray-capacitance boosting unit is connected to the object circuit, an output of the stray-capacitance boosting unit is connected to the sampling resistor, an input of the inverter is connected to the common point of the stray-capacitance boosting unit and the sampling resistor, an output of the inverter is connected to a negative terminal of the comparator, an positive terminal of the comparator is configured to receive a reference voltage, an output of the comparator is connected to a first input of the "AND" gate, a second input of the "AND" gate is configured to receive a gate pulse; and
determining whether the object circuit is open according to the electrical signal.

15. The method as claim 14, wherein the step of determining comprising:
converting the electrical signal into an identification signal by the signal processing unit; and
determining whether the object circuit is open according to the identification signal.

16. The method as claim 14, wherein the electrical signal indicates the capacitance of the parasitic capacitor in normal circuit is greater than the capacitance of the parasitic capacitor in open circuit.

17. The method as claim 14, wherein the step of testing comprises:
generating a burst pulse for charging the parasitic capacitor by the test unit, and discharging the parasitic capacitor though the sampling, unit to generate the electrical signal.

18. An electronic device, comprising:
an object circuit; and
an open circuit detecting system connected to the object circuit for getting an electrical signal through a virtual ground induced by characteristic impedance of a parasitic capacitor and determining whether the object circuit is open or not electrically connected to the open circuit detecting system according to the electrical signal, wherein the open circuit detecting system comprises a test unit, a stray-capacitance boosting unit, a sampling unit, and a signal processing unit;
wherein the sampling unit is a sampling resistor, the signal processing unit comprises an inverter, a comparator connected to the inverter, and an "AND" gate connected to the comparator, the test unit is connected to the stray-capacitance boosting unit, a second input of the stray-capacitance boosting unit is connected to the object circuit, an output of the stray-capacitance boosting unit is connected to the sampling resistor, an input of the inverter is connected to the common point of the stray-capacitance boosting unit and the sampling resistor, an output of the inverter is connected to a negative terminal of the comparator, an positive terminal of the comparator is configured to receive a reference voltage, an output of the comparator is connected to a first input of the "AND" gate, a second input of the "AND" gate is configured to receive a gate pulse.

19. The electronic device as claim 18, wherein the electrical signal obtained by the open circuit detecting system indicates that the capacitance of the parasitic capacitor in normal circuit is greater than that if the object circuit is open internally or not electrically connected to the open circuit detecting system.

* * * * *